United States Patent
Pagaila

(10) Patent No.: US 8,367,480 B2
(45) Date of Patent: *Feb. 5, 2013

(54) SEMICONDUCTOR DEVICE AND METHOD OF FORMING DAM MATERIAL AROUND PERIPHERY OF DIE TO REDUCE WARPAGE

(75) Inventor: Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/223,478

(22) Filed: Sep. 1, 2011

(65) Prior Publication Data

US 2011/0309488 A1    Dec. 22, 2011

Related U.S. Application Data

(63) Continuation of application No. 12/540,240, filed on Aug. 12, 2009, now Pat. No. 8,021,930.

(51) Int. Cl.
*H01L 21/00* (2006.01)

(52) U.S. Cl. ........ 438/124; 438/109; 438/113; 438/125; 438/127; 257/E21.001; 257/E21.502

(58) Field of Classification Search ................ 438/124, 438/126, 127
See application file for complete search history.

(56) References Cited

U.S. PATENT DOCUMENTS

| | | |
|---|---|---|
| 5,250,843 A | 10/1993 | Eichelberger |
| 5,353,498 A | 10/1994 | Fillion et al. |
| 5,841,193 A | 11/1998 | Eichelberger |
| 6,459,144 B1 | 10/2002 | Pu et al. |
| 6,734,571 B2 | 5/2004 | Bolken |
| 6,841,424 B2 | 1/2005 | Bolken |
| 7,259,456 B2 | 8/2007 | Wang |
| 7,619,901 B2 | 11/2009 | Eichelberger et al. |
| 7,927,924 B2 | 4/2011 | Cheng et al. |
| 2003/0068852 A1 | 4/2003 | Towle et al. |
| 2005/0062167 A1 | 3/2005 | Huang et al. |
| 2005/0230797 A1 | 10/2005 | Ho et al. |
| 2006/0051895 A1 | 3/2006 | Abe et al. |
| 2007/0034998 A1 | 2/2007 | Huang et al. |
| 2007/0126122 A1 | 6/2007 | Bauer et al. |
| 2007/0210427 A1 | 9/2007 | Lytle et al. |

*Primary Examiner* — Angel Roman

(74) *Attorney, Agent, or Firm* — Robert D. Atkins; Patent Law Group: Atkins & Associates, P.C.

(57) ABSTRACT

A semiconductor device has a carrier. A first semiconductor die is mounted to the carrier with an active surface of the first semiconductor die oriented toward the carrier. A dam structure is formed on the carrier and around the first semiconductor die by depositing dam material on the carrier with screen printing, electrolytic plating, electroless plating, or spray coating. An encapsulant is deposited over the carrier and around the first semiconductor die. The encapsulant has a coefficient of thermal expansion (CTE) that corresponds to a CTE of the dam material. The CTE of the dam material is equal to or less than the CTE of the encapsulant. The carrier is removed to expose the active surface of the first semiconductor die with the dam structure stiffening a periphery of the first semiconductor die. The semiconductor device is singulated through the dam structure.

28 Claims, 5 Drawing Sheets

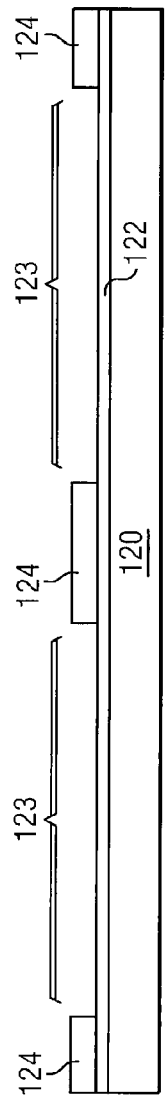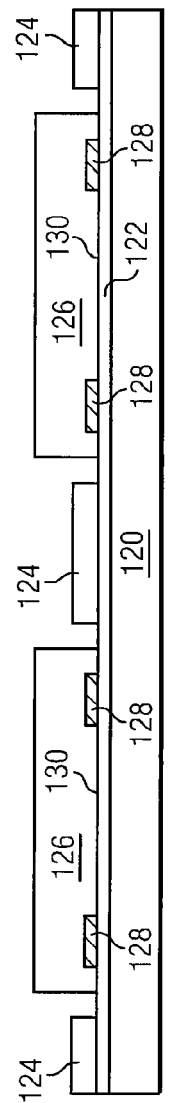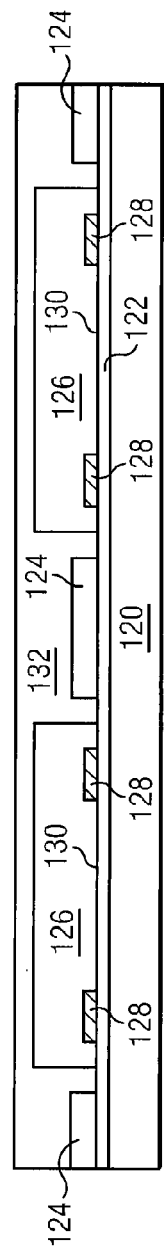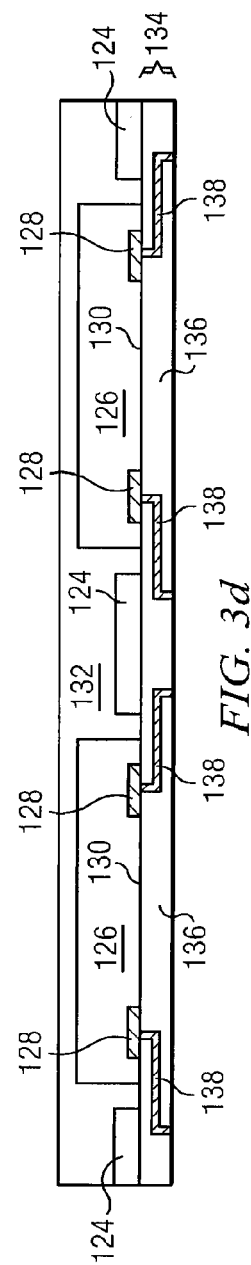
FIG. 3a
FIG. 3b
FIG. 3c
FIG. 3d

SEMICONDUCTOR DEVICE AND METHOD OF FORMING DAM MATERIAL AROUND PERIPHERY OF DIE TO REDUCE WARPAGE

CLAIM OF DOMESTIC PRIORITY

The present application is a continuation of U.S. patent application Ser. No. 12/540,240, filed Aug. 12, 2009, and claims priority to the foregoing parent application pursuant to 35 U.S.C. §120.

FIELD OF THE INVENTION

The present invention relates in general to semiconductor devices and, more particularly, to a semiconductor device and method of forming dam material around a periphery of a semiconductor die to reduce warpage.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection in a fan-out wafer level chip scale package (FO-WLCSP) containing semiconductor devices stacked on multiple levels can be accomplished with conductive through silicon vias (TSV), through hole vias (THV), or Cu-plated conductive pillars. Vias are formed in silicon or organic material around the die using laser drilling or deep reactive ion etching (DRIE). The vias are filled with conductive material, for example by copper deposition using an electroplating process, to form the conductive TSVs and THVs. The TSVs and THVs further connect through build-up interconnect structures which are formed across each semiconductor die. An encapsulant is deposited over the stacked semiconductor die.

A common failure issue for the FO-WLCSP is warpage. When the semiconductor die is mounted to a temporary carrier for encapsulation, a mismatch between the coefficient of thermal expansion (CTE) of the encapsulant and temporary carrier induces stress that can lead to warpage. In addition, after the FO-WLCSP is formed, a mismatch between the CTE of the encapsulant and build-up interconnect structure induces stress that can lead to warpage, e.g., during temperature cycling or extreme temperature testing. Device failure due to warpage should be avoided or at least minimized, particularly at the final stage of the manufacturing process when the defect is most costly.

SUMMARY OF THE INVENTION

A need exists to reduce warpage in a FO-WLCSP during the manufacturing process. Accordingly, in one embodiment, the present invention is a method of making a semiconductor device comprising the steps of providing a carrier, mounting a first semiconductor die with an active surface oriented toward the carrier, and forming a dam structure on the carrier and around the first semiconductor die by depositing dam material on the carrier with screen printing, electrolytic plating, electroless plating, or spray coating. The method further includes the steps of depositing an encapsulant over the carrier and around the first semiconductor die, removing the carrier to expose the active surface of the first semiconductor die with the dam structure stiffening a periphery of the first semiconductor die, and singulating the semiconductor device through the dam structure. The encapsulant has a CTE corresponding to a CTE of the dam material.

In another embodiment, the present invention is a method of making a semiconductor device comprising the steps of providing a carrier, mounting a semiconductor die over the carrier, forming a dam structure on the carrier and around the semiconductor die by depositing dam material on the carrier, depositing an encapsulant over the carrier and around the semiconductor die, and removing the carrier to expose the semiconductor die with the dam structure stiffening a periphery of the semiconductor die. The encapsulant has a CTE corresponding to a CTE of the dam material.

In another embodiment, the present invention is a method of making a semiconductor device comprising the steps of providing a semiconductor die, forming a dam structure around the semiconductor die by depositing dam material such that the dam structure stiffens a periphery of the semiconductor die, and depositing an encapsulant around the semiconductor die. The encapsulant has a CTE that corresponds to a CTE of the dam material.

In another embodiment, the present invention is a semiconductor device comprising a first semiconductor die. A dam structure is formed around the first semiconductor die that stiffens a periphery of the first semiconductor die. An encapsulant is deposited around the first semiconductor die. The encapsulant has a CTE corresponding to a CTE of the dam structure. A first interconnect structure is formed over the first semiconductor die and encapsulant.

BRIEF DESCRIPTION OF THE DRAWINGS

FIGS. 3a-3e illustrate a process of forming dam material around a periphery of a semiconductor die to reduce warpage in the FO-WLCSP;

DETAILED DESCRIPTION OF THE DRAWINGS

Figure 1:
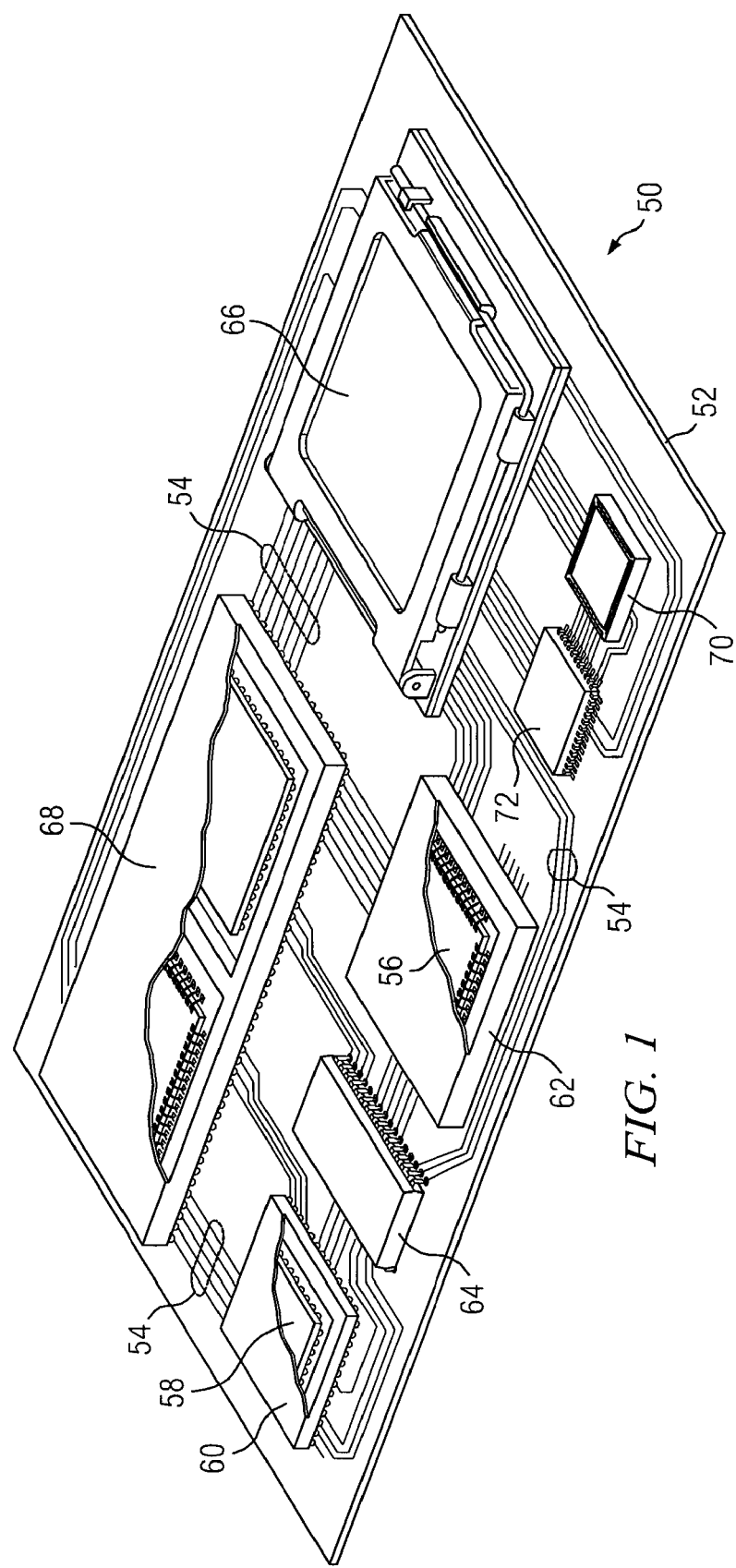
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
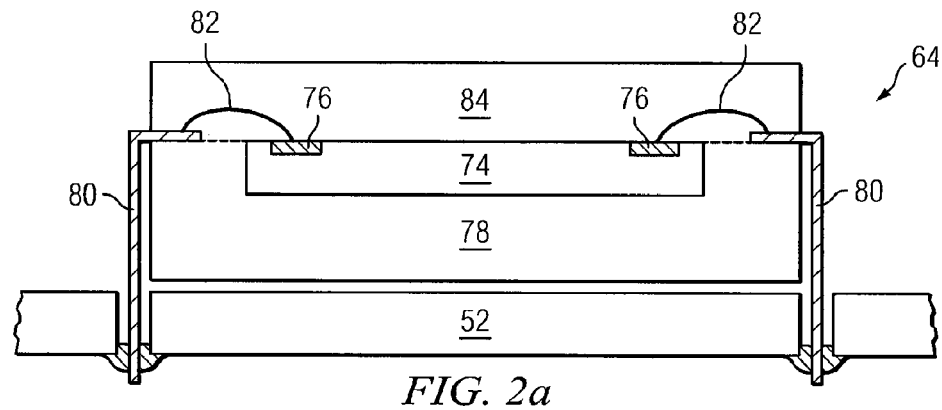
FIGS. 2a-2c illustrate further detail of the representative semiconductor packages mounted to the PCB.
Figure 2B:
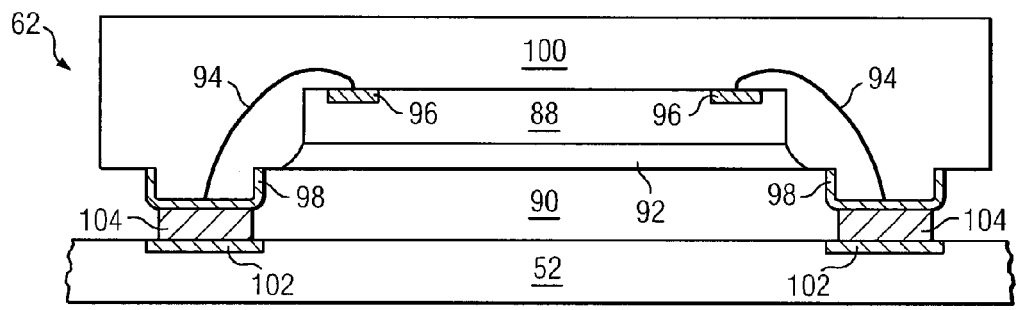
Figure 2C:
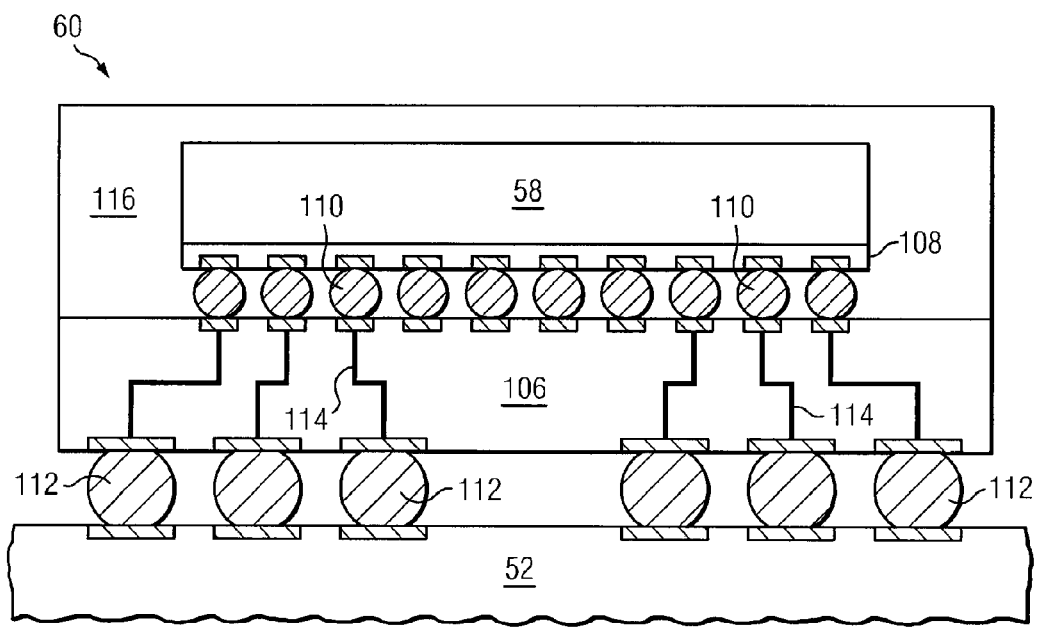

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3E:
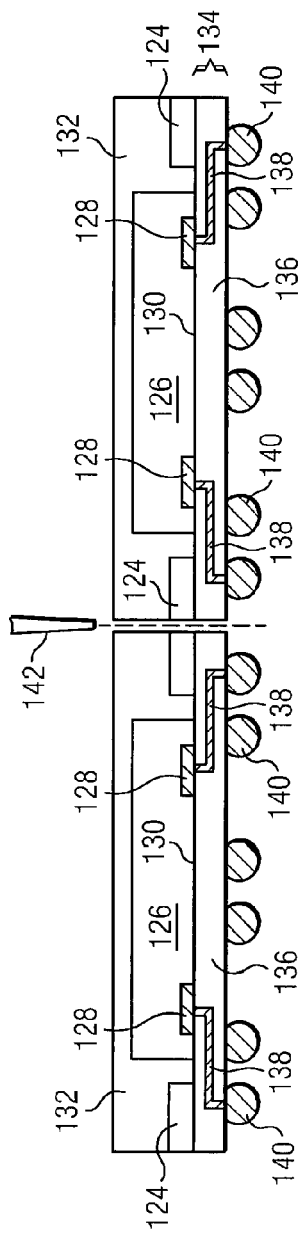

FIGS. 3a-3e illustrate, in relation to FIGS. 1 and 2a-2c, a process of forming dam material around a periphery of a semiconductor die to reduce warpage in the FO-WLCSP. In FIG. 3a, a wafer-form substrate or carrier 120 contains temporary or sacrificial base material such as silicon, polymer, polymer composite, metal, ceramic, glass, glass epoxy, beryllium oxide, or other suitable low-cost, rigid material or bulk semiconductor material for structural support. Carrier 120 can also be tape. An optional interface layer 122 can be formed over carrier 120 as a temporary adhesive bonding film or etch-stop layer.

Carrier 120 has an area 123 designated for mounting a semiconductor die. A dam material 124 is deposited over interface layer 122, at least partially or completely around a periphery of area 123. Dam material 124 can be an adhesive, polymer, or metallic layer. Dam material 124 is formed by screen printing, electrolytic plating, electroless plating, spray coating, or other suitable deposition process depending on the material.

In FIG. 3b, semiconductor die or component 126 is mounted to designated area 123 on interface layer 122 with contact pads 128 on active surface 130 oriented downward toward carrier 120. Active surface 130 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 126 may also contain IPD, such as inductors, capacitors, and resistors, for RF signal processing. A typical RF system requires multiple IPDs in one or more semiconductor packages to perform the necessary electrical functions.

In FIG. 3c, an encapsulant or molding compound 132 is deposited over dam material 124 and semiconductor die 126 using a paste printing, compressive molding, transfer molding, liquid encapsulant molding, vacuum lamination, spin coating, or other suitable applicator. Encapsulant 132 can be polymer composite material, such as epoxy resin with filler, epoxy acrylate with filler, or polymer with proper filler. Encapsulant 132 is non-conductive and environmentally protects the semiconductor device from external elements and contaminants.

In FIG. 3d, temporary carrier 120 and optional interface layer 122 are removed by chemical etching, mechanical peel-off, CMP, mechanical grinding, thermal bake, laser scanning, or wet stripping. A bottom-side build-up interconnect structure 134 is formed over dam material 124, semiconductor die 126, and encapsulant 132. The build-up interconnect structure 134 includes an insulating or passivation layer 136 containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 136 is formed using PVD, CVD, printing, spin coating, spray coating, sintering or thermal oxidation.

The bottom-side build-up interconnect structure 134 further includes an electrically conductive layer 138 formed in insulating layer 136 using a patterning and metal deposition process such as PVD, CVD, sputtering, electrolytic plating, and electroless plating. Conductive layer 138 can be one or more layers of Al, Cu, Sn, Ni, Au, Ag, or other suitable electrically conductive material. One portion of conductive layer 138 is electrically connected to contact pads 128 of semiconductor die 126. Other portions of conductive layer 138 can be electrically common or electrically isolated depending on the design and function of the semiconductor device.

In FIG. 3e, an electrically conductive bump material is deposited over build-up interconnect structure 134 and electrically connected to conductive layer 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 138 using a suitable attachment or bonding process. In one embodiment, the bump material is reflowed by heating the material above its melting point to form spherical balls or bumps 140. In some applications, bumps 140 are reflowed a second time to improve electrical contact to conductive layer 138. The bumps can also be compression bonded to conductive layer 138. Bumps 140 represent one type of interconnect structure that can be formed over conductive layer 138. The interconnect structure can also use bond wires, stud bump, micro bump, or other electrical interconnect.

Figure 4:
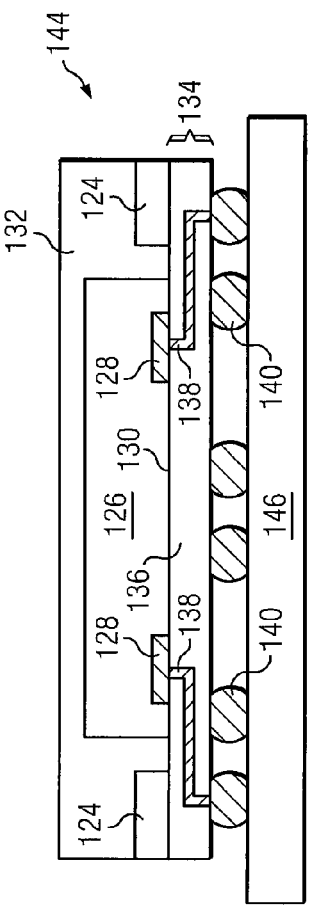
FIG. 4 illustrates the FO-WLCSP mounted to a PCB with dam material formed around a periphery of the semiconductor die.

Semiconductor die 126 are singulated with saw blade or laser cutting device 142 into individual semiconductor devices. FIG. 4 shows FO-WLCSP 144 after singulation mounted to PCB 146. Semiconductor die 126 is electrically connected to bottom-side build-up interconnect structure 134 and bumps 140. Dam material 124 has an opposite warpage characteristic as encapsulant 132. For example, encapsulant 132 tends to concave and dam material 124 tends to convex with increasing temperature. Dam material 124 stiffens the periphery of semiconductor die 126 after encapsulation due to the opposing warpage properties. In addition, dam material 124 is selected to have a CTE that corresponds to the CTE of encapsulant 132, i.e., the CTE of dam material 132 is similar to or slightly less than the CTE of encapsulant 132. The CTE of dam material 124 compensates for stress induced by the encapsulated semiconductor die 126 mounted to build-up interconnect structure 134 in FO-WLCSP 144 during temperature cycling and extreme temperature testing. By reducing warpage and CTE-induced stress, FO-WLCSP 144 has reduced solder joint failure, particularly around the periphery of the semiconductor die.

Figure 5:
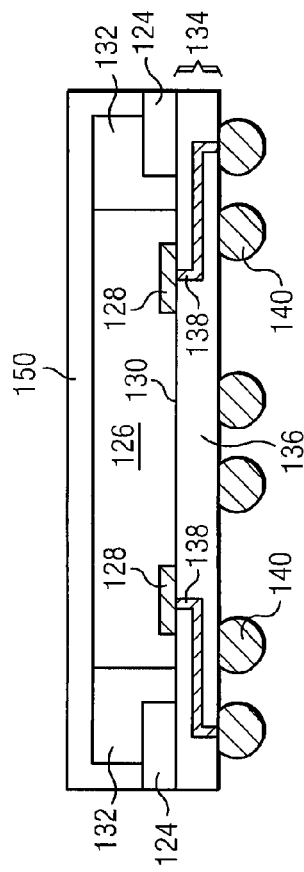
FIG. 5 illustrates an EMI shielding layer formed around the semiconductor die.

FIG. 5 shows a shielding layer 150 formed over the top and sides of semiconductor die 126 and encapsulant 132. Shielding layer 150 can be Cu, Al, ferrite or carbonyl iron, stainless steel, nickel silver, low-carbon steel, silicon-iron steel, foil, epoxy, conductive resin, and other metals and composites capable of blocking or absorbing electromagnetic interference (EMI), radio frequency interference (RFI), and other inter-device interference. Shielding layer 150 can also be a non-metal material such as carbon-black or aluminum flake to reduce the effects of EMI and RFI. Shielding layer 150 is grounded through conductive layer 138 to bumps 140.

Figure 6:
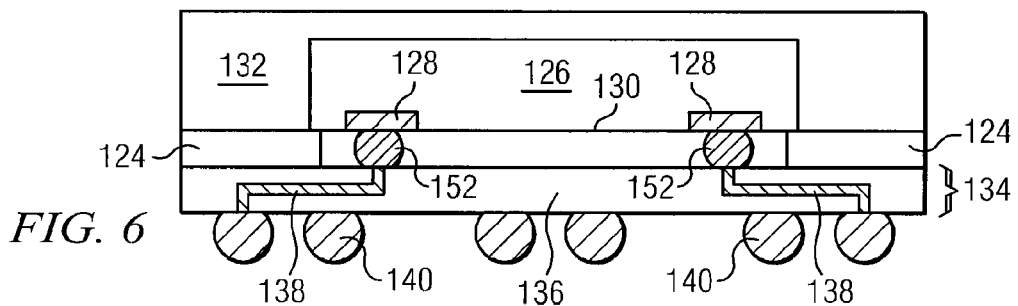
FIG. 6 illustrates the semiconductor die supported by the dam material to prevent collapse of the interconnect bump.

FIG. 6 shows interconnect bumps 152 formed between contact pads 128 of semiconductor die 126 and conductive layer 138 in build-up interconnect structure 134. Semiconductor die 126 is supported by dam material 124, which reduces the potential for collapse of bumps 152.

Figure 7:
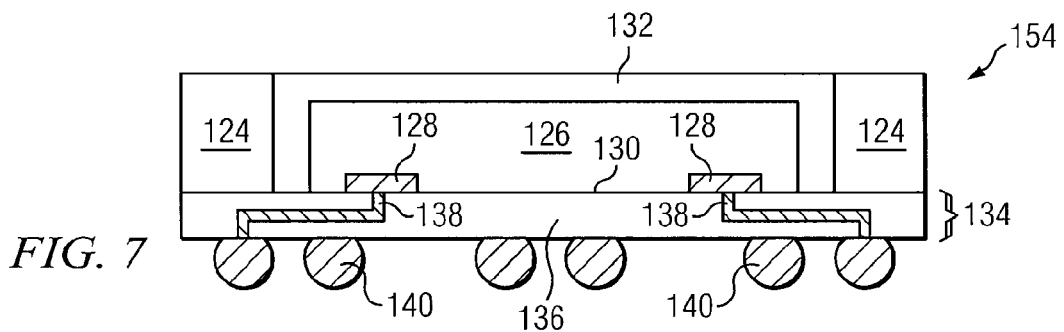
FIG. 7 illustrates the dam material extending up to a top surface of the encapsulant.

FIG. 7 shows FO-WLCSP 154 with dam material 124 formed up to the top surface of encapsulant 132. Dam material 124 is exposed from FO-WLCSP 154.

Figure 8:
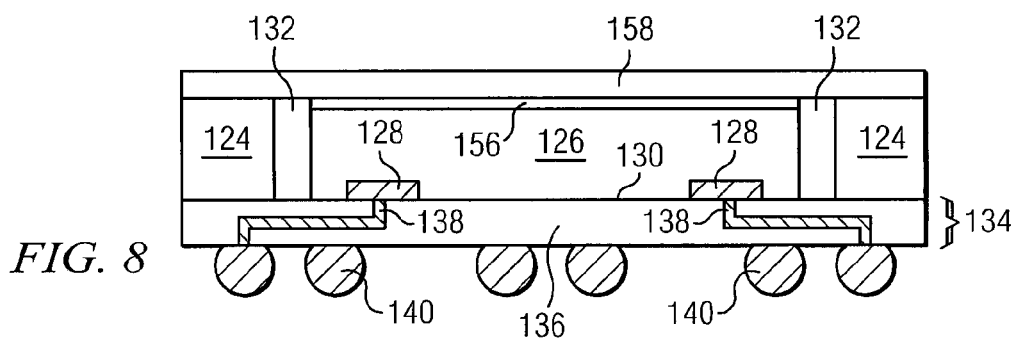
FIG. 8 illustrates a TIM and heat sink formed over the semiconductor die.

FIG. 8 shows dam material 124 formed up to the top surface of encapsulant 132 and exposed from the FO-WLCSP, as described in FIG. 7. A thermal interface material (TIM) 156 is deposited over the back surface of semiconductor die 126, opposite active surface 130. TIM 156 can be aluminum oxide, zinc oxide, boron nitride, or pulverized silver. A heat sink 158 is mounted over TIM 156, encapsulant 132, and dam material 124. Heat sink 158 can be Al, Cu, or another material with high thermal conductivity to provide heat dissipation for semiconductor die 126. TIM 156 aids in the distribution and dissipation of heat generated by semiconductor die 126.

Figure 9:
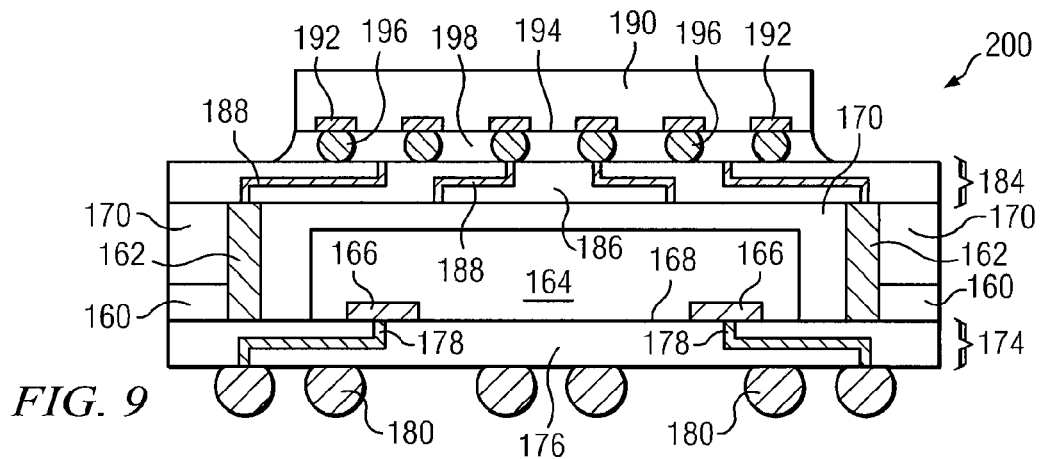
FIG. 9 illustrates a semiconductor die and topside build-up interconnect structure formed over the encapsulant.

FIG. 9 illustrates another embodiment of the FO-WLCSP with dam material formed around a periphery of the semiconductor die. A dam material 160 is deposited over a temporary carrier and optional interface layer, at least partially or completely around a periphery of the area designated for the semiconductor die 164. Dam material 160 can be an adhesive, polymer, or metallic layer. Dam material 160 is formed by screen printing, electrolytic plating, electroless plating, spray coating, or other suitable deposition process depending on the material.

One or more layers of photoresist are deposited over the carrier and optional interface layer. A portion of the photoresist is exposed and removed by an etch development process to form vias. Conductive material, such as Al, Cu, Sn, Ni, Au, Ag, titanium (Ti), tungsten (W), solder, poly-silicon, or combination thereof, is deposited in the vias using a selective plating process. The photoresist is stripped away leaving behind individual conductive pillars 162. In another embodiment, conductive pillars 162 can be formed as stud bumps or stacked bumps.

A semiconductor die or component 164 is mounted to the carrier and optional interface layer with contact pads 166 on active surface 168 oriented downward toward the carrier. Active surface 168 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 168 to implement analog circuits or digital circuits, such as DSP, ASIC, memory, or other signal processing circuit. Semiconductor die 164 may also contain IPD, such as inductors, capacitors, and resistors, for RF signal processing. A typical RF system requires multiple IPDs in one or more semiconductor packages to perform the necessary electrical functions.

An encapsulant or molding compound 170 is deposited over dam material 160 and semiconductor die 164 using a paste printing, compressive molding, transfer molding, liquid encapsulant molding, vacuum lamination, spin coating, or other suitable applicator. Encapsulant 170 can be polymer composite material, such as epoxy resin with filler, epoxy acrylate with filler, or polymer with proper filler. Encapsulant 170 is non-conductive and environmentally protects the semiconductor device from external elements and contaminants.

The temporary carrier and optional interface layer are removed by chemical etching, mechanical peel-off, CMP, mechanical grinding, thermal bake, laser scanning, or wet stripping. A bottom-side build-up interconnect structure 174 is formed over dam material 160, semiconductor die 164, and encapsulant 170. The build-up interconnect structure 174 includes an insulating or passivation layer 176 containing one or more layers of SiO2, Si3N4, SiON, Ta2O5, Al2O3, or other material having similar insulating and structural properties. The insulating layer 176 is formed using PVD, CVD, printing, spin coating, spray coating, sintering or thermal oxidation.

The bottom-side build-up interconnect structure 174 further includes an electrically conductive layer 178 formed in insulating layer 176 using a patterning and metal deposition process such as PVD, CVD, sputtering, electrolytic plating, and electroless plating. Conductive layer 178 can be one or more layers of Al, Cu, Sn, Ni, Au, Ag, or other suitable electrically conductive material. One portion of conductive layer 178 is electrically connected to contact pads 166 of semiconductor die 164; another portion of conductive layer 178 is electrically connected to conductive pillars 162. Other portions of conductive layer 178 can be electrically common or electrically isolated depending on the design and function of the semiconductor device.

An electrically conductive bump material is deposited over build-up interconnect structure 174 and electrically connected to conductive layer 178 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 178 using a suitable attachment or bonding process. In one embodiment, the bump material is reflowed by heating the material above its melting point to form spherical balls or bumps 180. In some applications, bumps 180 are reflowed a second time to improve electrical contact to conductive layer 178. The bumps can also be compression bonded to conductive layer 178. Bumps 180 represent one type of interconnect structure that can be formed over conductive layer 138. The interconnect structure can also use bond wires, stud bump, micro bump, or other electrical interconnect.

A topside build-up interconnect structure 184 is formed over a surface of encapsulant 170 opposite active surface 168. The build-up interconnect structure 184 includes an insulating or passivation layer 186 containing one or more layers of SiO2, Si3N4, SiON, Ta2O5, Al2O3, or other material having similar insulating and structural properties. The insulating layer 186 is formed using PVD, CVD, printing, spin coating, spray coating, sintering or thermal oxidation.

The topside build-up interconnect structure 184 further includes an electrically conductive layer 188 formed in insulating layer 186 using a patterning and metal deposition process such as PVD, CVD, sputtering, electrolytic plating, and electroless plating. Conductive layer 188 can be one or more layers of Al, Cu, Sn, Ni, Au, Ag, or other suitable electrically conductive material. One portion of conductive layer 188 is electrically connected to conductive pillars 162. Other portions of conductive layer 188 can be electrically common or electrically isolated depending on the design and function of the semiconductor device.

A semiconductor die or component 190 is mounted to topside build-up interconnect structure 184 with contact pads 192 on active surface 194 oriented downward toward the build-up interconnect structure. Active surface 194 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 194 to implement analog circuits or digital circuits, such as DSP, ASIC, memory, or other signal processing circuit. Semiconductor die 190 may also contain IPD, such as inductors, capacitors, and resistors, for RF signal processing. A typical RF system requires multiple IPDs in one or more semiconductor packages to perform the necessary electrical functions. In another embodiment, a discrete semiconductor device can be mounted to topside build-up interconnect structure 184. Bumps 196 electrically connect contact pads 192 of semiconductor die 190 to conductive layer 188. An underfill material 198 such as epoxy resin is deposited beneath semiconductor die 190.

In FO-WLCSP 200, semiconductor die 164 and 190 are electrically connected to bottom-side build-up interconnect structure 174 and bumps 180 and topside build-up interconnect structure 184 through z-direction interconnect conductive pillars 162. Dam material 160 has an opposite warpage characteristic as encapsulant 170. For example, encapsulant 170 tends to concave and dam material 160 tends to convex with increasing temperature. Dam material 160 stiffens the periphery of semiconductor die 164 after encapsulation due to the opposing warpage properties. In addition, dam material 160 is selected to have a CTE that corresponds to the CTE of encapsulant 170, i.e., the CTE of dam material 160 is similar to or slightly less than the CTE of encapsulant 170. The CTE of dam material 170 compensates for stress induced by the encapsulated semiconductor die 126 mounted to build-up interconnect structure 174 in FO-WLCSP 200 during temperature cycling and extreme temperature testing. By reducing warpage and CTE-induced stress, FO-WLCSP 200 has reduced solder joint failure, particularly around the periphery of the semiconductor die.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   disposing a first semiconductor die including an active surface oriented toward the carrier;
   forming a dam structure on the carrier and around the first semiconductor die by depositing dam material on the carrier;
   depositing an encapsulant over the dam structure and around the first semiconductor die with the encapsulant including a warpage characteristic opposite a warpage characteristic of the dam structure to stiffen a periphery of the first semiconductor die;
   removing the carrier to expose the active surface of the first semiconductor die; and
   singulating the semiconductor device through the dam structure.

2. The method of claim 1, further including selecting a coefficient of thermal expansion (CTE) of the dam material to be equal to or less than a CTE of the encapsulant.

3. The method of claim 1, further including disposing a heat sink or shielding layer over the encapsulant and first semiconductor die.

4. The method of claim 1, further including forming the dam structure with a height equal to a height of the encapsulant.

5. The method of claim 1, further including:
   supporting the first semiconductor die by the dam structure; and
   forming a bump over the active surface of the first semiconductor die.

6. The method of claim 1, further including:
   forming a first interconnect structure over the active surface of the first semiconductor die;
   forming a second interconnect structure over a back surface of the first semiconductor die opposite the active surface of the first semiconductor die; and
   forming a conductive pillar between the first and second interconnect structures.

7. A method of making a semiconductor device, comprising:
   providing a semiconductor die;
   forming a dam structure around the semiconductor die by depositing dam material; and
   depositing an encapsulant over the dam structure and around the semiconductor die with the encapsulant including a warpage characteristic opposite a warpage characteristic of the dam structure.

8. The method of claim 7, further including selecting a coefficient of thermal expansion (CTE) of the dam material to be equal to or less than a CTE of the encapsulant.

9. The method of claim 7, further including disposing a heat sink or shielding layer over the encapsulant and semiconductor die.

10. The method of claim 7, further including forming the dam structure with a height equal to a height of the encapsulant.

11. The method of claim 7, further including singulating the semiconductor device through the dam structure.

12. The method of claim 7, further including supporting the semiconductor die by the dam structure.

13. The method of claim 7, further including:
    forming a first interconnect structure over a first surface of the semiconductor die;
    forming a second interconnect structure over a second surface of the semiconductor die opposite the first surface of the semiconductor die; and
    forming a conductive pillar between the first and second interconnect structures.

14. A method of making a semiconductor device, comprising:
    providing a semiconductor die;
    forming a dam structure around the semiconductor die; and
    depositing an encapsulant over the dam structure and around the semiconductor die with the encapsulant including a warpage characteristic opposite a warpage characteristic of the dam structure.

15. The method of claim 14, further including selecting a coefficient of thermal expansion (CTE) of the dam structure to be equal to or less than a CTE of the encapsulant.

16. The method of claim 14, further including disposing a heat sink or shielding layer over the encapsulant and semiconductor die.

17. The method of claim 14, further including forming the dam structure with a height equal to a height of the encapsulant.

18. The method of claim 14, further including singulating the semiconductor device through the dam structure.

19. The method of claim 14, further including disposing the semiconductor die over a portion of the dam structure.

20. A method of making a semiconductor device, comprising:
    providing a first semiconductor die;
    depositing a dam material around the first semiconductor die to form forming a dam structure including a first warpage characteristic; and
    depositing an encapsulant around the first semiconductor die with the encapsulant including a second warpage characteristic opposite a first warpage characteristic.

21. The method of claim 20, wherein a coefficient of thermal expansion (CTE) of the dam material is equal to or less than a CTE of the encapsulant.

22. The method of claim 20, further including disposing a heat sink or shielding layer over the encapsulant and first semiconductor die.

23. The method of claim 20, further including forming the dam structure with a height equal to a height of the encapsulant.

24. The method of claim 20, further including:
    supporting the first semiconductor die by the dam structure; and
    forming a bump over the active surface of the first semiconductor die.

25. The method of claim 20, further including:
    forming a first interconnect structure over a first the first semiconductor die;

forming a second interconnect structure over a second surface of the first semiconductor die opposite the first surface of the first semiconductor die; and forming a conductive pillar between the first and second interconnect structures.

26. The method of claim 25, further including disposing a second semiconductor die over the second interconnect structure.

27. The method of claim 6, further including disposing a second semiconductor die over the second interconnect structure.

28. The method of claim 13, further including disposing a second semiconductor die over the second interconnect structure.

* * * * *